United States Patent [19]
Kim

[11] Patent Number: 5,882,824
[45] Date of Patent: Mar. 16, 1999

[54] PHASE-SHIFTING MASK AND METHOD FOR MANUFACTURING THE SAME

[75] Inventor: Byeong Chan Kim, Kyungki-do, Rep. of Korea

[73] Assignee: LG Semicon Co., Ltd., Cheongju, Rep. of Korea

[21] Appl. No.: 879,045

[22] Filed: Jun. 19, 1997

[30] Foreign Application Priority Data

Dec. 26, 1996 [KR] Rep. of Korea .................. 1996/72202

[51] Int. Cl.⁶ ...................................................... G03F 9/00
[52] U.S. Cl. ................................................ 430/5; 430/323
[58] Field of Search ............................. 430/5, 322, 323, 430/324, 314

[56] References Cited

U.S. PATENT DOCUMENTS

| | | | |
|---|---|---|---|
| 5,437,947 | 8/1995 | Hur et al. ..................................... | 430/5 |
| 5,705,300 | 10/1995 | Bae ............................................. | 430/5 |

OTHER PUBLICATIONS

A. Lmai, et al., "Microlithography World", Summer 1996, p. 10.

*Primary Examiner*—S. Rosasco
*Attorney, Agent, or Firm*—Fleshner & Kim

[57] ABSTRACT

Phase-shifting mask which minimizes thickness and phase variations of a phase-shifting layer, and the method for manufacturing the same, the phase-shifting mask including a transparent substrate, a plurality of light-shielding layers formed in the transparent substrate; and a plurality of phase-shifting layers each formed on the transparent substrate between the light-shielding layers; and the method including the steps of providing a transparent substrate, defining transparent regions and light-shielding regions so as to form a plurality of trenches, channels or recesses in each of the light-shielding regions of the transparent substrate, forming each of a plurality of light-shielding layers in each of the plurality of trenches, channels or recesses, and forming a phase-shifting layer on the transparent substrate at least between a pair of the light-shielding layers.

11 Claims, 7 Drawing Sheets

PHASE-SHIFTING MASK AND METHOD FOR MANUFACTURING THE SAME

BACKGROUND OF THE INVENTION

1. Field of the Invention

The present invention relates to a phase-shifting mask and more particularly, to a phase-shifting mask for making a semiconductor device and a method for manufacturing the same.

2. Background of the Related Art

In photolithography processes which are commonly used for manufacturing semiconductor devices, a photomask including a portion transmitting light in a desired form of a semiconductor device and a portion shielding light, has very frequently been used. That is to say, a conventional photomask includes a transparent pattern and a light-shielding pattern, thus permitting selective exposure. However, as the pattern density is increased, light diffraction limits improvement of the resolution. Therefore, much research and development has been directed to improving resolution by using a phase-shifting mask.

In a technique using a phase-shifting mask, there is utilized a combination of a transparent region and a phase-shifting transparent region. Herein, in the transparent region, light is transmitted. In the phase-shifting transparent region, the light to be transmitted is phase-shifted by about 180°. This technique prevents the customary decrease in resolution between the pattern created by the light-shielding and the transparent regions. Throughout the development of manufacturing techniques for masks, various masks have been introduced by applying light phase differences that thus improve on the limitations of optical resolution.

Levenson initially started the alternate type phase-shifting mask as a phase-shifting mask, and Nitayama et al. made a phase-shifting mask of a rim type in order to improve resolution of a contact hole.

A conventional method for manufacturing a phase-shifting mask is now discussed with reference to the attached drawings.

FIGS. 1a to 1h are cross-sectional views showing a manufacturing process for a conventional phase-shifting mask.

First, shown in FIG. 1a, a light-shielding layer 2 and a first photoresist layer $PR_1$ are sequentially formed on a transparent substrate 1. In this case, the light-shielding layer 2 is made of, for example, $Cr_2O_5$.

Secondly, using exposure and development, the first photoresist layer $PR_1$ is patterned to form a photoresist pattern arranged at predetermined intervals, thereby defining shielding regions, as shown in FIG. 1b.

Thereafter, as shown in FIG. 1c, with the first photoresist pattern $PR_1$ serving as a mask, the light-shielding layer 2 is selectively removed to form a light-shielding layer pattern 2a. The exposed transparent substrate 1 thus provides opening regions 3 through which light may be transmitted.

Next, the remaining first photoresist layer $PR_1$ on the shielding layer pattern 2a is removed, as shown in FIG. 1d.

Subsequently, on the entire surface of the transparent substrate 1 inclusive of the light-shielding pattern 2a, there are sequentially formed a spin on glass (SOG) layer 4 and a second photoresist layer $PR_2$, as shown in FIG. 1e. In this case, as a phase-shifting layer, the SOG layer 4 is formed thick enough to cause a desired phase shift as regards the exposure beam. Due to step coverage of the opening region 3 and the light-shielding layer pattern 2a, the second photoresist layer $PR_2$ and the SOG layer 4 are formed to have different thicknesses at the boundary A between the opening region 3 and the light-shielding layer pattern 2a. At this time, the thicknesses of the layers $PR_2$ and 4 are thicker at the boundary A.

Referring to FIG. 1f, utilizing exposure and development, the second photoresist layer $PR_2$ is patterned so that the second photoresist layer $PR_2$ is left on the opening region 3 at only one side of the light-shielding layer pattern 2a. In this case, the second photoresist layer pattern $PR_2$ overlaps with the light-shielding layer pattern 2a by a predetermined amount. That is, arrangement tolerance is utilized.

Next, utilizing the second photoresist layer pattern $PR_2$ as a mask, the SOG layer 4 is selectively removed so that the SOG layer 4 is left on the opening region 3 at only one side of the light-shielding layer pattern 2a, as shown in FIG. 1g.

Finally, as shown in FIG. 1h, the remaining second photoresist layer $PR_2$ is removed so that there is formed a phase-shifting mask which transmits light of the opposite phase as a result of the remaining SOG layer 4.

Such a conventional phase-shifting mask as described above has several disadvantages. For example, due to the step coverage between a light-shielding layer and an opening region, the thickness of a phase-shifting layer formed over the opening region is not uniform, resulting in a phase-shifting error of the light which has crossed the phase-shifting layer. Thus, it is difficult to transcribe a precise pattern by using a conventional phase-shifting mask, and it is not easy to reproducibly provide a phase-shifting mask of a good reliability.

The above references are incorporated by reference herein where appropriate for appropriate teachings of additional or alternative details, features and/or technical background.

SUMMARY OF THE INVENTION

The present invention is directed to a phase-shifting mask and a manufacturing method thereof that substantially obviates one or more of problems due to limitations and disadvantages of the prior art.

An object of the invention is thus to provide a phase-shifting mask in which a light-shielding layer is formed in trenches, channels or recesses in a transparent substrate so as to be substantially flush with the surface of the transparent substrate.

Another object of the invention is to minimize a thickness change a of a phase-shifting layer to reduce the phase-shifting error, and a manufacturing method thereof.

To achieve this and other advantages and in accordance with the purpose of the present invention, as embodied and described in detail, the phase-shifting mask includes a transparent substrate, a plurality of light-shielding layers formed in the transparent substrate, and a phase-shifting layer formed on the transparent substrate at least between the light-shielding layers.

In another aspect of the invention, there is provided a method for manufacturing a phase-shifting mask including the steps of preparing a transparent substrate; defining and creating transparent regions and light-shielding regions so as to form a plurality of trenches, channels or recesses in the transparent substrate of the light-shielding regions; forming pairs of light-shielding layers in the plurality of trenches, channels or recesses; and forming a phase-shifting layer on the transparent substrate between each of the pairs of light-shielding layers.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

The invention provides for a phase-shifting mask useful in the production of semiconductor devices, and methods of making and using same.

Figure 1A:
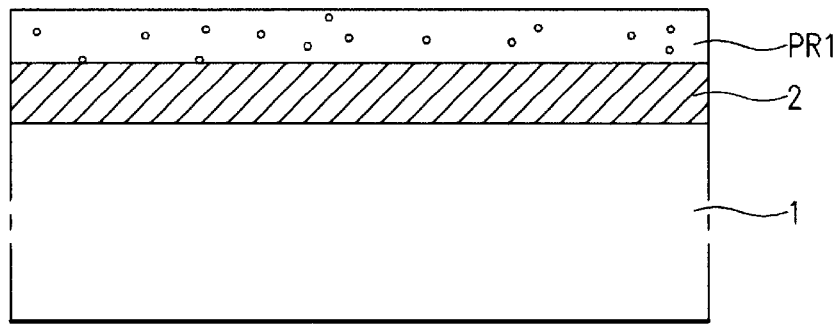
FIGS. 1a to 1h are cross-sectional views showing the results of the steps in a manufacturing process of a conventional phase-shifting mask.
Figure 1B:
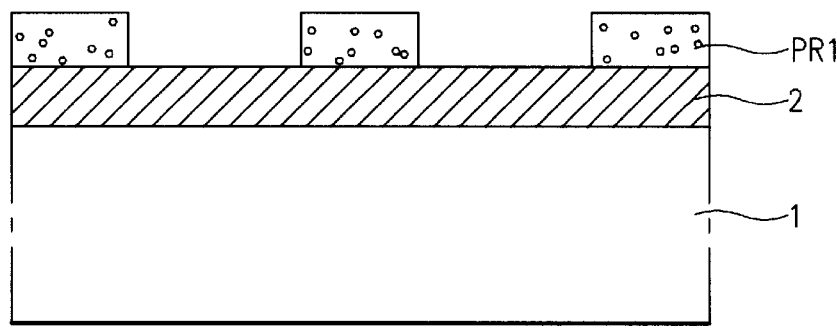
Figure 1C:
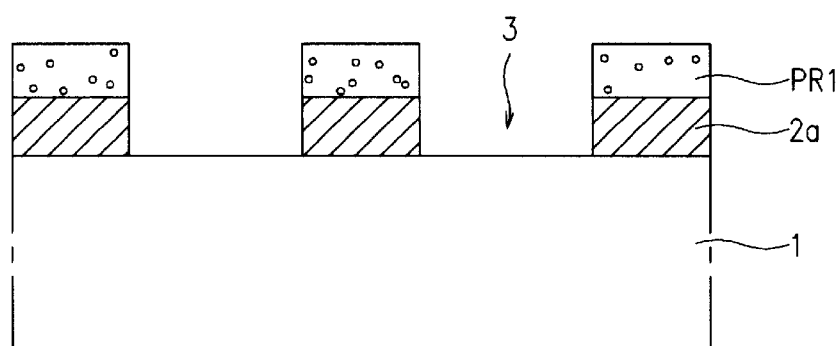
Figure 1D:
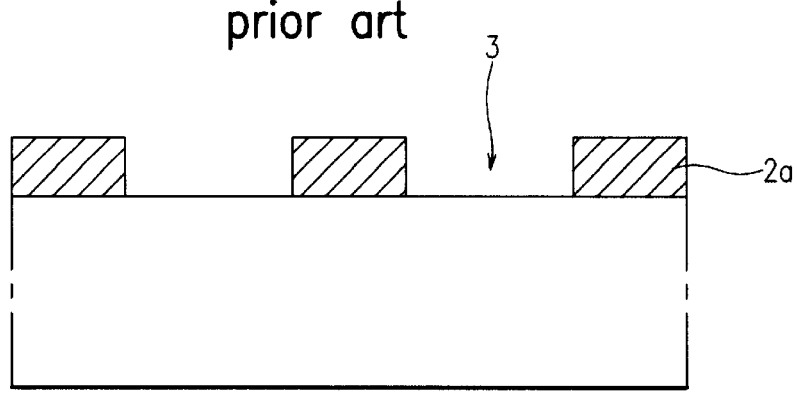
Figure 1E:
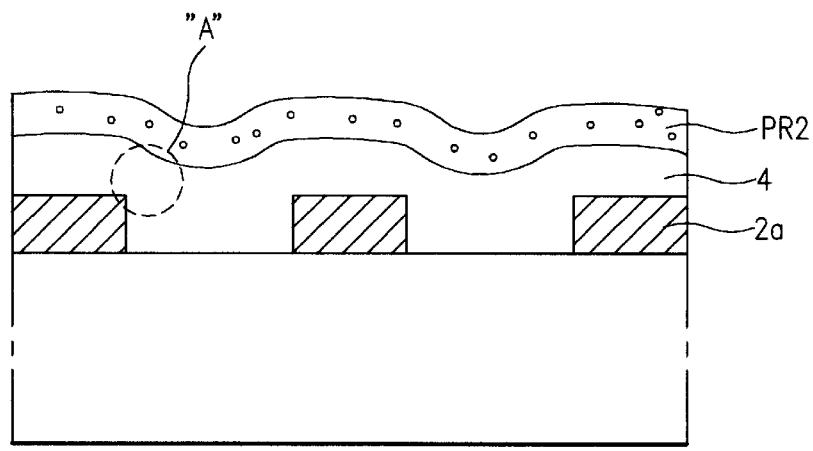
Figure 1F:
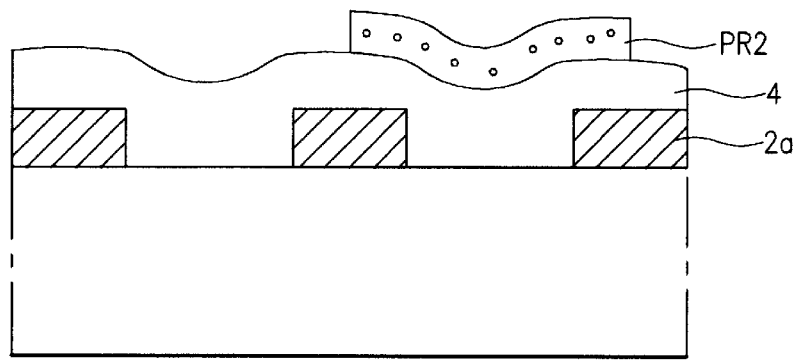
Figure 1G:
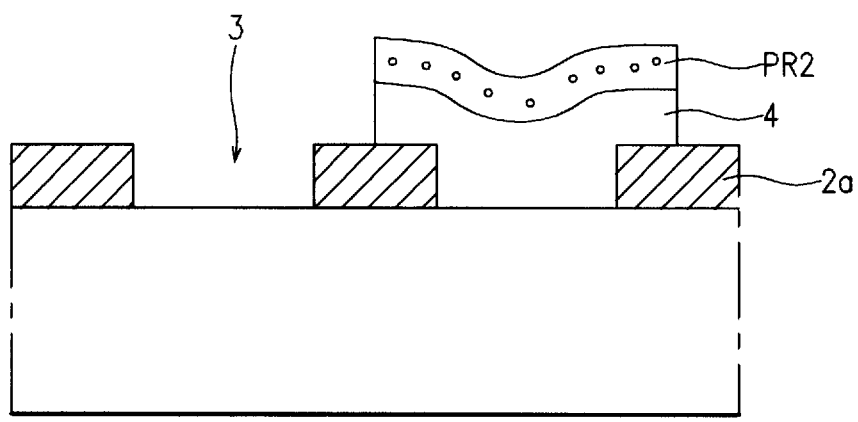
Figure 1H:
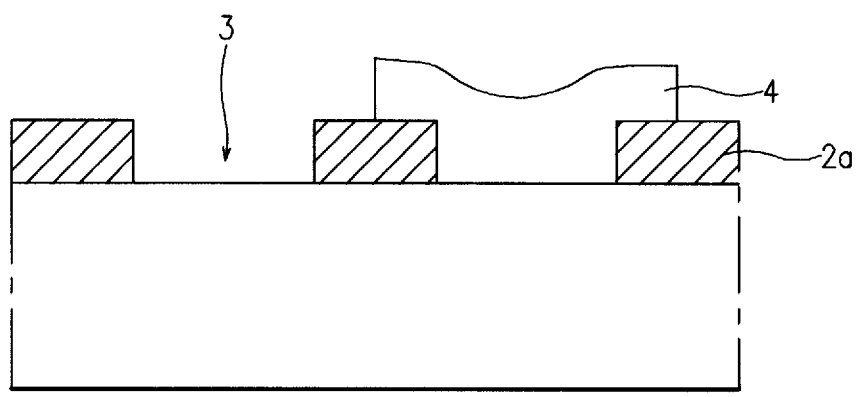
Figure 2:
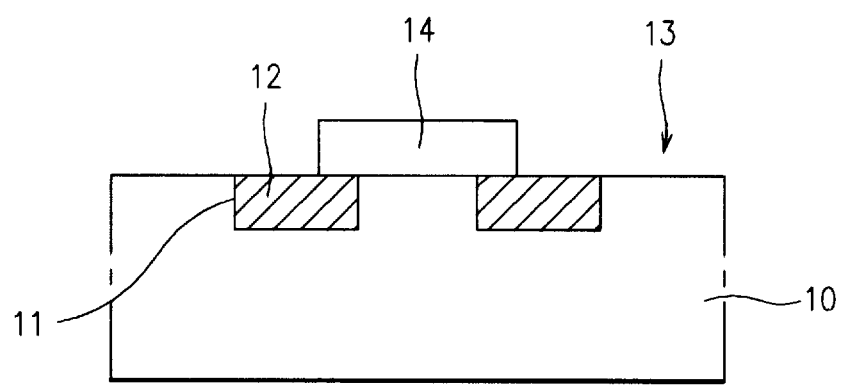
FIG. 2 is a cross-sectional view showing a structure of an exemplary phase-shifting mask according to the invention.

FIG. 2 is a cross-sectional view showing a structure of a phase-shifting mask according to the invention.

As shown in FIG. 2, a phase-shifting mask of the invention includes a transparent substrate 10, a plurality of light-shielding layers 12 formed in the transparent substrate 10, and a phase-shifting layer 14 formed on the transparent substrate 10 at least between the light-shielding layers 12.

In this embodiment of the invention, the plurality of light-shielding layers 12 are formed in a plurality of trenches 11 formed in the transparent substrate 10. The reference numeral 13 represents a transparent region. The plurality of light shielding layers 12 are as high as (i.e., substantially flush with) the surface of the transparent substrate 10. The phase-shifting layer 14 is formed to overlap with the adjacent light-shielding layers 12 by a predetermined area.

Referring FIGS. 3a to 3j, there is provided a manufacturing process of a phase-shifting mask according to a preferred embodiment of the invention.

Figure 3A:
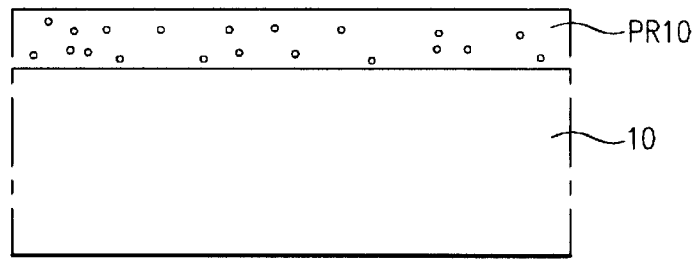
FIGS. 3a to 3j are cross-sectional views showing exemplary results of a manufacturing process for a phase-shifting mask according to a preferred embodiment of the invention.

First, as shown in FIG. 3a, a first photoresist layer $PR_{10}$ is coated on a transparent substrate 10, which is made of, for example, either glass or quartz.

Figure 3B:
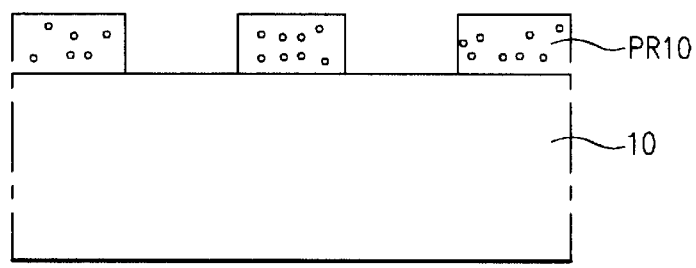

Secondly, as shown in FIG. 3b, the first photoresist layer $PR_{10}$, after being subjected to exposure and development, is patterned to expose the surface of the transparent substrate 10 in a predefined fashion so that the first photoresist layer $PR_{10}$ has predetermined intervals.

Figure 3C:
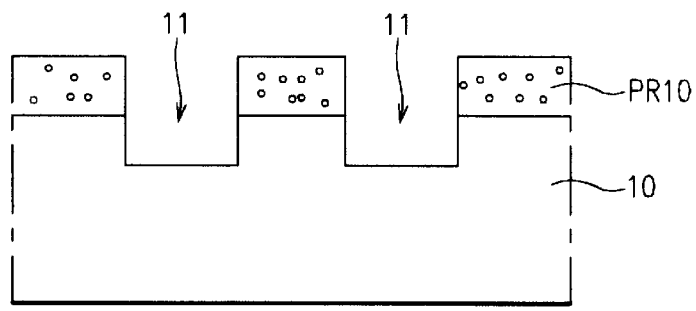

Next, with the first photoresist layer pattern $PR_{10}$ serving as a mask, the transparent substrate 10 is removed to a predetermined depth to form a plurality of trenches 11, as shown in FIG. 3c. At this time, an anisotropic dry etch is used employing an etching gas such as $CHF_3$ or $CF_4$ when the transparent substrate 10 is etched to be removed.

Figure 3D:
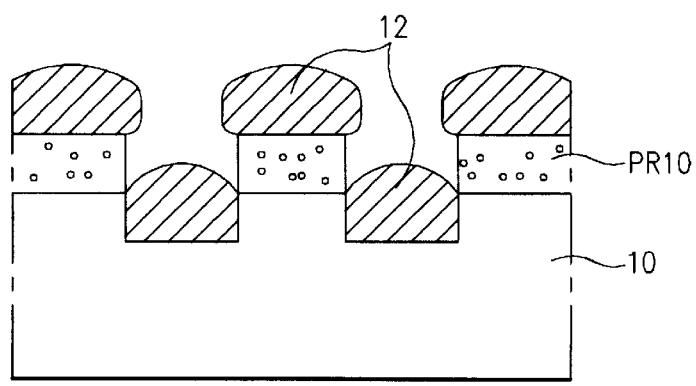

Referring to FIG. 3d, a plurality of light-shielding layers 12 of a light-shielding material, e.g. chromium (Cr) are formed in the plurality of trenches 11. Since a physical vapor deposition (PVD) method may be conveniently used to form the plurality of light-shielding layers 12, the plurality of light-shielding layers 12 are formed only on the first photoresist layer $PR_{10}$ and within the trenches, but not on the sides of the first photoresist layer $PR_{10}$.

Figure 3E:
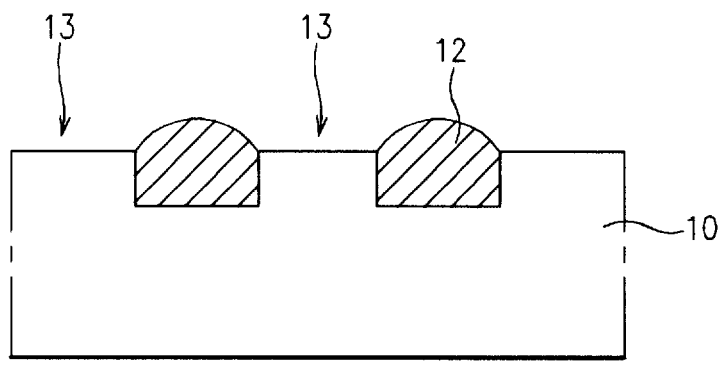

Referring to FIG. 3e, wet stripping or dry stripping is applied to the first photoresist layer $PR_{10}$. In this case, the light-shielding layer 12 on the first photoresist layer $PR_{10}$ is removed by the lift-off method and then the first photoresist layer $PR_{10}$ is removed to expose the surface of the transparent substrate 10. Herein, the exposed substrate 10 contains transparent regions 13.

Figure 3F:
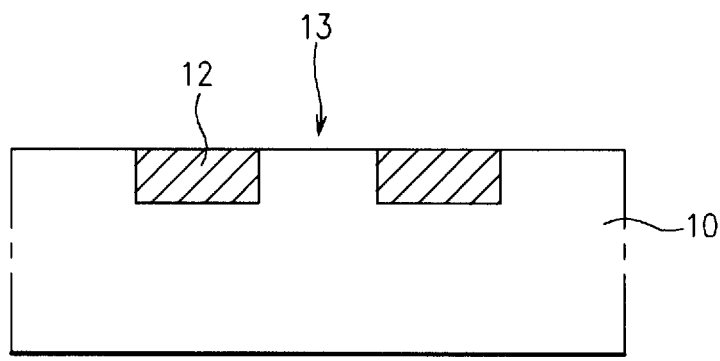

Referring to FIG. 3f, the light-shielding layer 12 is polished until it is planarized to be as high as (i.e., substantially flush with) the surface of the transparent substrate 10.

Figure 3G:
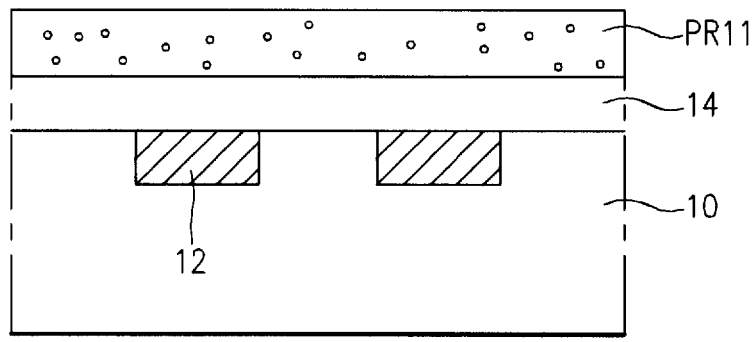

Referring to FIG. 3g, a phase-shifting layer 14 and a second photoresist layer $PR_{11}$ are sequentially formed on the entire surface inclusive of the light-shielding layer 12 and the transparent substrate 10 which is defined as the transparent regions 13. The phase-shifting layer 14, made of a transparent material, has a phase-shifting thickness d and is formed of, for example, spin-on-glass (SOG).

The thickness of the phase-shifting layer 14 is predetermined by a formula: $d=\lambda/2(n-1)$. In the formula, "d" is the thickness of the phase-shifting layer 14, "$\lambda$" is the wavelength of the light and "n" is the refractivity of the transparent substrate.

Figure 3H:
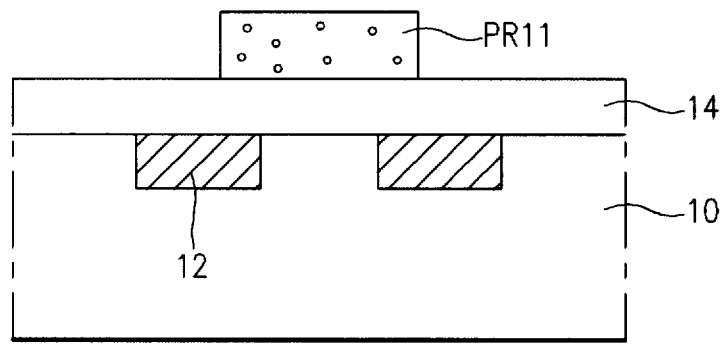

Referring to FIG. 3h, by exposure and development, the second photoresist layer $PR_{11}$ is patterned so that the second photoresist layer $PR_{11}$ is left on the phase-shifting region. In this case, the phase-shifting region and the transparent region 13 are defined alternately. That is, one second photoresist layer pattern $PR_{11}$ is formed per a pair of the light-shielding layers 12. In one embodiment, the second photoresist layer pattern $PR_{11}$ overlaps with the pair of light-shielding layers 12.

Figure 3I:
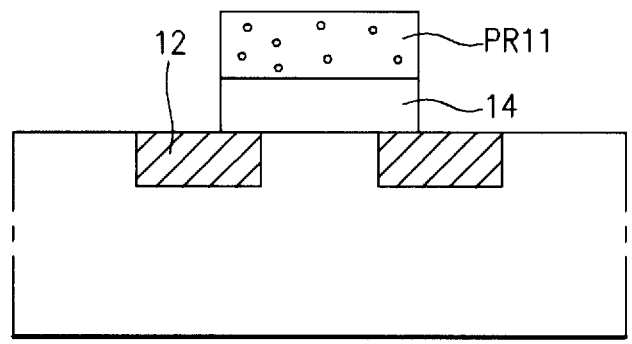

Referring to FIG. 3i, with the second photoresist layer pattern $PR_{11}$ serving as a mask, the phase-shifting layer $PR_{11}$ is selectively removed so that the phase-shifting layer $PR_{11}$ is left only on the phase-shifting regions between and preferably overlapping the pair of light-shielding regions 12. Accordingly, the transparent regions 13 and the phase-shifting layers 14 are formed by turns.

Figure 3J:
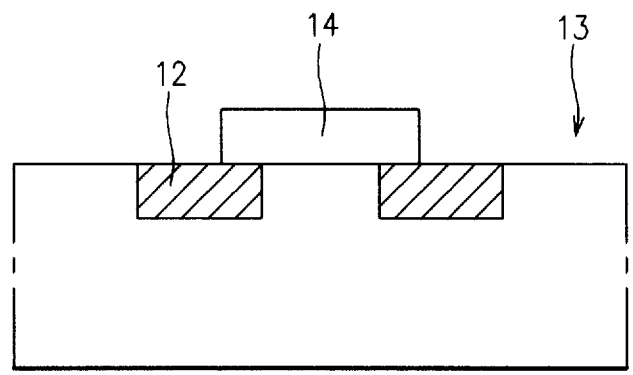

Referring finally to FIG. 3j, the remaining second photoresist layer $PR_{11}$ is removed.

The phase-shifting mask of the invention has many advantages. Since a light-shielding layer may be, and preferably, is formed to be as high as the surface of (substantially flush with) a transparent substrate, the phase-shifting layer can be formed to have a substantially uniform thickness. Consequently, there are generated few errors of phase shift of the light transmitted through the phase-shifting layer and it is possible to transcribe a precise pattern, thereby reproducibly making a phase-shifting mask of good reliability.

The foregoing embodiments are merely exemplary and are not to be construed as limiting the present invention. For example, in a preferred embodiment the light-shielding layer is substantially flush with the surface of the substrate but may also be to a substantially uniform level below the surface of the substrate (i.e., partially-filled trenches, channels or recesses). Likewise, it is preferred that the substrate be highly transparent to the incident irradiation (e.g., light) though low transparencies are also operable under the invention. Moreover, it is preferred that the phase-shifting layer overlap the borders of the light-shielding layers, though it is also sufficient that just the region between the light-shielding layers is covered with the phase-shifting layers. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A phase-shifting mask comprising:

a transparent substrate;

a plurality of light-shielding portions formed in trenches, channels or recesses in the transparent substrate such that entire top surfaces of the light-shielding portions are substantially flush with a top surface of the substrate; and, a plurality of phase-shifting portions formed on the transparent substrate, wherein a majority of at least one of the phase-shifting portions is located between two adjacent light-shielding portions, wherein each of the phase-shifting portions overlaps with edges of a pair of adjacent light-shielding portions, and wherein a thickness d of the phase shifting portions is substantially equal to $\lambda/2(n-1)$, where $\lambda$ is a wavelength of light and n is a refractivity of the transparent substrate.

2. A method for manufacturing a phase-shifting mask comprising the steps of:

providing a transparent substrate;

defining transparent regions and light-shielding regions on the substrate;

forming a photoresist layer on the substrate and selectively removing portions of the photoresist layer to expose the surface of the substrate at the light-shielding regions;

etching the exposed portions of the substrate to form a plurality of trenches;

depositing a light-shielding material by a physical vapor deposition (PVD) method on the entire surface of the substrate, including the trenches;

lifting-off the photoresist layer and the light-shielding material thereon;

planarizing the remaining light-shielding material to form a plurality of light-shielding portions in the trenches, wherein entire top surfaces of the light-shielding portions are substantially flush with a top surface of the transparent substrate; and forming a phase-shifting portion on the transparent substrate such that a majority of the phase-shifting portion is located between an adjacent pair of the light-shielding portions.

3. The method of claim 2, wherein said transparent substrate is made of transparent glass or quartz.

4. The method of claim 2, wherein $CHF_3$ gas or $CF_4$ gas is used to etch the transparent substrate to a predetermined depth.

5. The method of claim 2, wherein the planarizing step comprises a polishing process.

6. The method of claim 2, wherein said phase-shifting portion comprises spin on glass.

7. The method of claim 2, wherein said phase-shifting portion overlaps with edges of a pair of the light-shielding portions.

8. The method of claim 2, wherein said light-shielding material comprises chromium.

9. A phase-shifting mask comprising:

a substrate;

a plurality of irradiation-shielding portions formed in the substrate such that entire top surfaces of the irradiation-shielding portions are substantially flush with a top surface of the substrate; and, at least one irradiation phase-shifting portion formed on the substrate such that the phase-shifting portion is located between an adjacent pair of light-shielding portions and such that edges of the phase-shifting portion overlap edges of the adjacent irradiation-shielding portions, and wherein a surface of the at least one irradiation phase-shifting portion is substantially flush with a surface of the substrate.

10. The phase-shifting mask of claim 9, wherein the at least one phase-shifting portion shifts the phase of an incident radiation by about 180°.

11. The phase-shifting mask of claim 9, wherein the substrate is transparent to a predetermined incident irradiation.

* * * * *